(12) United States Patent
Chaiken (10) Patent No.: US 6,274,463 B1
(45) Date of Patent: Aug. 14, 2001

(54) FABRICATION OF A PHOTOCONDUCTIVE OR A CATHOCONDUCTIVE DEVICE USING LATERAL SOLID OVERGROWTH METHOD

(75) Inventor: Alison Chaiken, Fremont, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/628,566

(22) Filed: Jul. 31, 2000

(51) Int. Cl.$^7$ .................................................. H01L 21/20
(52) U.S. Cl. .......................................................... 438/486
(58) Field of Search ..................................... 438/478, 479, 438/480, 481, 482, 486, 487, 496, 973

(56) References Cited

U.S. PATENT DOCUMENTS

| | | | |
|---|---|---|---|
| 4,760,036 | 7/1988 | Schubert | 437/90 |
| 4,910,167 | 3/1990 | Lee et al. | 437/132 |
| 5,024,723 | 6/1991 | Goesele | 156/628 |
| 5,296,717 | 3/1994 | Valister et al. | 257/13 |
| 5,302,544 | 4/1994 | Levine | 437/53 |
| 5,312,765 | 5/1994 | Kanber | 437/22 |
| 5,438,951 | 8/1995 | Tachikawa et al. | 117/84 |
| 5,502,316 | 3/1996 | Kish | 257/94 |
| 5,557,596 | 9/1996 | Gibson et al. | 369/101 |
| 5,625,617 | 4/1997 | Hopkins et al. | 369/121 |
| 5,663,078 | 9/1997 | McCarthy | 438/157 |
| 5,694,410 | 12/1997 | Motoda et al. | 372/45 |
| 5,835,521 | 11/1998 | Ramdani | 372/96 |
| 5,854,090 | 12/1998 | Iwai et al. | 438/47 |
| 5,943,560 | 8/1999 | Chang et al. | 438/164 |
| 5,976,959 | 11/1999 | Huang | 438/487 |
| 6,028,875 | 2/2000 | Knight et al. | 372/46 |

FOREIGN PATENT DOCUMENTS

99/54128    10/1999    (WO).

OTHER PUBLICATIONS

Moniwa, et al., "Influence of Si film thickness on growth enhancement in Si lateral solid phase epitaxy", Appl. Phys. Lett. 52 (21) pp. 1788–1790, May 1988.*

Howard M. Brantz, Amorphous and Heterogeneous Silicon Thin Films: Fundamentals to Devices, 1999, pp. 171, 172, 173, 174, 175.

Masahiro Moniwa, Influence of Si Film Thickness on Growth Enhancement in Si Lateral Solid Phase Epitaxy, May 1988, pp. 1788, 1789, 1790.

* cited by examiner

*Primary Examiner*—Keith Christianson
(74) *Attorney, Agent, or Firm*—Trueman H. Denny, III (57) ABSTRACT

A method for crystallizing an amorphous film formed on an underlying layer having an unfavorable crystalline growth morphology is disclosed. The method includes providing a favorable growth substrate and then forming a first unfavorable growth layer on a seeding surface of the favorable growth substrate. An aperture is etched in the first unfavorable growth layer so that the aperture extends through the first unfavorable growth layer down to the seeding surface thereby exposing a portion of the seeding surface. An amorphous media layer is then formed on the first unfavorable growth layer. The amorphous media layer fills the aperture and is in contact with the seeding surface of the favorable growth substrate. A crystallized media layer is formed by annealing the amorphous media layer so that nucleation of a crystalline phase of the amorphous media layer begins at the seeding surface and propagates throughout the entirety of the amorphous media layer so that the remainder of the amorphous media layer is crystallized to form the crystallized media layer. Consequently, the crystallized media layer has a useful morphology due to nucleation of crystallization on the favorable growth substrate while being formed on the first unfavorable growth layer which tends to induce an unfavorable crystalline growth morphology. The crystallized media layer can be used as a data storage medium in an ultra-high density data storage device.

24 Claims, 5 Drawing Sheets

FABRICATION OF A PHOTOCONDUCTIVE OR A CATHOCONDUCTIVE DEVICE USING LATERAL SOLID OVERGROWTH METHOD

BACKGROUND OF THE INVENTION

The present invention relates generally to seeding a media layer using its most favorable growth substrate. More specifically, the present invention relates to seeding the crystallization of a media layer using a substrate that encourages a favorable growth morphology, while fabricating the media layer on one or more layers that lead to an unfavorable growth morphology.

Articles and publications set forth herein are presented for the information contained therein: none of the information is admitted to be statutory "prior art" and we reserve the right to establish prior inventorship with respect to any such information.

BACKGROUND ART

There are many cases in thin film device processing where a given material grows with a favorable morphology on one substrate type but not on another. One method for improving growth morphology on an unfavorable growth substrate is to deposit an underlayer (i.e. a buffer layer) on the substrate having an unfavorable growth morphology, followed by depositing an active layer on the buffer layer. The buffer layer must promote a favorable growth morphology for the active layer. In particular, for photoconductive or cathoconductive devices such as those potentially used in high-density data storage devices, an ideal buffer layer would include: a favorable growth morphology for a data layer that is deposited on the buffer layer; a smooth surface upon which to deposit the data layer; the buffer layer must be electrically insulating and thermally conductive; and the buffer layer must be non-reactive with both the data layer and the substrate the buffer layer is deposited on. Unfortunately, a buffer layer which meets all those requirements may not exist.

Another method for improving growth morphology on an unfavorable growth substrate is to use a wafer-bonding approach. In this method, an active layer is deposited on a first substrate that includes a layer having a favorable growth morphology, then the first substrate may be mechanically bonded to a second substrate having an unfavorable growth morphology. However, bonding the first and second wafers with the degree of flatness and robustness needed for many applications would be very difficult. The first and second substrates can be made from similar or dissimilar materials. For example, the first substrate can be a semiconductor substrate and the second substrate can be glass. Additionally, wafer bonding often requires several processing steps to planarize the active layer and to reduce the thickness of the first and/or the second substrate. The planarization steps can include chemical mechanical polishing (CMP) and the substrates can be reduced in thickness by planarization and/or by wet/dry etching steps. Those steps can often result in damage to the active layer and the number of steps involved complicate the fabrication process and can result in reduced yield. Moreover, applications that require a high degree of flatness and separation control between substrates will not tolerate wafer bonding. For instance, in ultra-high density storage devices, information can be written onto the active layer and read from the active layer using an electron beam current. Any damage to the active layer or variations in the thickness of the active layer can result in the data being corrupted or the inability to accurately write data to or read data from the active layer. A more detailed discussion of ultra-high density storage devices and the storage of data in a storage medium can be found in U.S. Pat. No. 5,557,596 to Gibson et al.

Accordingly, there is a need to seed the growth of an active layer using its most favorable growth substrate without resorting to the use of a buffer layer or wafer bonding. Furthermore, there is a need to seed the growth of the active layer without having to deposit the active layer directly on a substrate having a favorable growth morphology.

SUMMARY OF THE INVENTION

The method of the present invention discloses a solution wherein growth of a media layer is seeded on its most favorable substrate without using a buffer layer or wafer bonding. Uses for the media layer of the present invention include but are not limited to a medium for an ultra-high density data storage device that stores data in the media layer using a coherent beam of light or an electron beam, for example.

One advantage of the present invention is that standard microelectronic processing steps and commonly available processing equipment can be used to crystallize an amorphous media layer. For instance, lateral solid epitaxial overgrowth is a commonly used technique for silicon on insulator (SOI) and gallium nitride (GaN) device fabrication and that technique can be used to deposit the media layer of the present invention. See for example, Moniwa et al., Applied Physics Letters, Vol. 52, No. 21, pg. 1788, May 23, 1988. Moreover, the overgrowth of the media layer is applied not with the goal of making a silicon (Si) device on a Si wafer, but to make a compound semiconductor device on an insulating layer like silicon oxide ($SiO_2$), for example.

Another advantage of the present invention is that it permits the seeding of the growth of a compound semiconductor material such as a III–VI material, a I–III–VI material, or a IV–V–VI material on silicon, a favorable substrate for growth, while fabricating the actual device on an insulating layer such as $SiO_2$, an unfavorable substrate for growth but a useful substrate for photoconductive and cathoconductive devices. $SiO_2$ and its analogs like $SiN_x$ are also useful dielectric layers for heterojunction diodes which also may be used in high-density data storage devices. The media layer of the present invention has the appropriate electrical properties for use in a photoconductive or photovoltaic detector scheme as part of an ultra-high density storage device.

Broadly, the present invention is embodied in a method for crystallizing an amorphous film formed on an underlaying layer having an unfavorable crystalline growth morphology. A favorable growth substrate has a first unfavorable growth layer formed a seeding surface thereof. An aperture is formed in the first unfavorable growth layer. The aperture extends through the first unfavorable growth layer down to the favorable growth substrate and exposes the seeding surface. An amorphous media layer is formed on the first unfavorable growth layer. The amorphous media layer covers the first unfavorable growth layer so that a portion of the amorphous media layer fills the aperture and is in contact with the seeding surface. A crystallized media layer is formed by annealing the amorphous media layer. Resulting is a nucleation of a crystalline phase of the amorphous media layer that begins at the seeding surface and propagates into the remainder of the amorphous media layer so that the entirety of the amorphous media layer is crystallized. The crystallized media layer is then treated to destroy electrical communication between the crystallized media layer and the favorable growth substrate. Essentially, the crystallized media layer is electrically insulated from the favorable growth substrate to prevent a short circuit between the favorable growth substrate and the crystallized media layer.

In one embodiment of the present invention, the first unfavorable growth layer is a dielectric material that electrically insulates the favorable growth substrate from the crystallized media layer.

In another embodiment of the present invention, a second unfavorable growth layer is formed on the first unfavorable growth layer.

In one embodiment of the present invention, the second unfavorable growth layer is a dielectric material.

In another embodiment of the present invention, the second unfavorable growth layer is an electrically conductive material.

In yet another embodiment of the present invention, the favorable growth substrate is a semiconductor material.

In one embodiment of the present invention, the amorphous media layer is annealed to crystallize the amorphous media layer by heating the amorphous media layer with a laser beam that is incident on the amorphous media layer.

In another embodiment of the present invention, the annealing step includes heating the amorphous media layer to crystallize the amorphous media layer.

In one embodiment of the present invention, the amorphous media layer can be a III–VI material, a I–III–VI material, or a IV–V–VI material on silicon.

Additional embodiments, aspects, and advantages of the present invention will become apparent from the following detailed description, taken in conjunction with the accompanying drawings, illustrating by way of example the principles of the present invention.

DETAILED DESCRIPTION

In the following detailed description and in the several figures of the drawings, like elements are identified with like reference numerals.

As shown in the drawings for purpose of illustration, the present invention is embodied in a method for crystallizing an amorphous film formed on an underlying layer having an unfavorable crystalline growth morphology. The method includes providing a favorable growth substrate and then forming (i.e. depositing) a first unfavorable growth layer on a seeding surface of the favorable growth substrate. A photolithography process or the like can be used to pattern and then etch an aperture that extends through the first unfavorable growth layer down to the seeding surface thereby exposing a portion of the seeding surface. An amorphous media layer is then formed on the first unfavorable growth layer. The amorphous media layer fills the aperture and is in contact with the seeding surface of the favorable growth substrate. A crystallized media layer is formed by annealing the amorphous media layer so that nucleation of a crystalline phase of the amorphous media layer begins at the seeding surface (i.e. where the amorphous media layer is in contact with the seeding surface) and propagates throughout the entire amorphous media layer so that the remainder of the amorphous media layer is crystallized to form the crystallized media layer. Consequently, the crystallized media layer has a morphology that favors that of the favorable growth substrate while being formed on the first unfavorable growth layer having an unfavorable crystalline growth morphology. Characteristics of the morphology of the crystallized media layer that favor that of the favorable growth substrate include promotion of a single-phase, large grain, single texture growth and/or correct phase.

One advantage of the method of the present invention is that standard microelectronic processing steps and commonly available processing equipment can be used to crystallize the amorphous media layer. Accordingly, the additional process steps and complexity of wafer bonding are eliminated. Furthermore, the possible loss of good working devices due to yield losses in a wafer bonding process are substantially reduced using the method of the present invention.

Moreover, the method of the present invention eliminates the need to deposit the media layer on a buffer layer that induces a favorable growth morphology. Instead, the media layer is deposited on an unfavorable growth layer that electrically insulates the media layer from the favorable growth substrate while providing a substantially smooth, thermally conductive, and non-reactive surface for the media layer.

Figure 1:
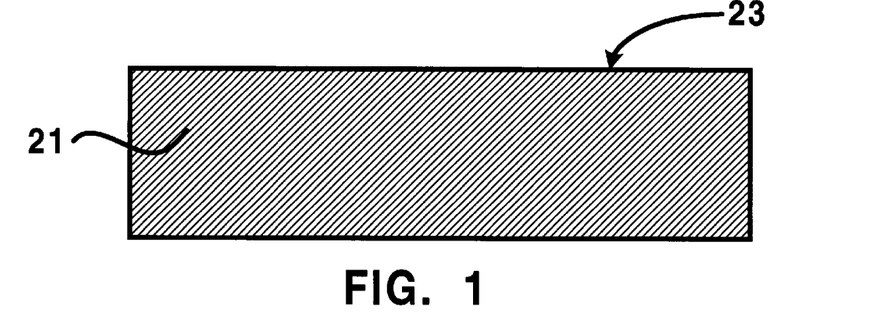
FIG. 1 is a cross-sectional view of a favorable growth substrate according to the present invention.

In FIG. 1, the method of the present invention includes providing a favorable growth substrate 21 having a seeding surface 23. The favorable growth substrate 21 can be a semiconductor material that includes but is not limited to silicon (Si), silicon germanium (SiGe), or gallium arsenide (GaAs). The thickness of the favorable growth substrate 21 will be application dependent; however, a typical single crystal silicon substrate can have a thickness of from about 0.40 millimeters to about 1.0 millimeters depending on the diameter of the wafer. For instance, a 10 or 12 inch wafer can have a thickness of about 0.8 millimeters to about 1.0 millimeters.

For some applications, such as in ultra-high density data storage devices, it is desirable to reduce the mass of the favorable growth substrate 21. The mass can be reduced by grinding, polishing, or the like to reduce the thickness of the favorable growth substrate 21. The actual thickness of the favorable growth substrate 21 will be application dependent. In one embodiment of the present invention, the favorable growth substrate 21 has a thickness of about 100 $\mu$m or less. Preferably, reducing the thickness of the favorable growth substrate 21 should be done prior to the providing step described above in reference to FIG. 1.

In another embodiment of the present invention, the seeding surface 23 of the favorable growth substrate 21 is oriented along a predetermined crystalline plane of the favorable growth substrate 21. Orientations for the predetermined crystalline plane include but are not limited to a (111) plane and a (100) plane. For instance, for Si, an especially favorable crystalline orientation for the seeding surface 23 is the (111) plane. On the other hand, for GaAs, an especially favorable crystalline orientation for the seeding surface 23 is the (100) plane.

Figure 2:
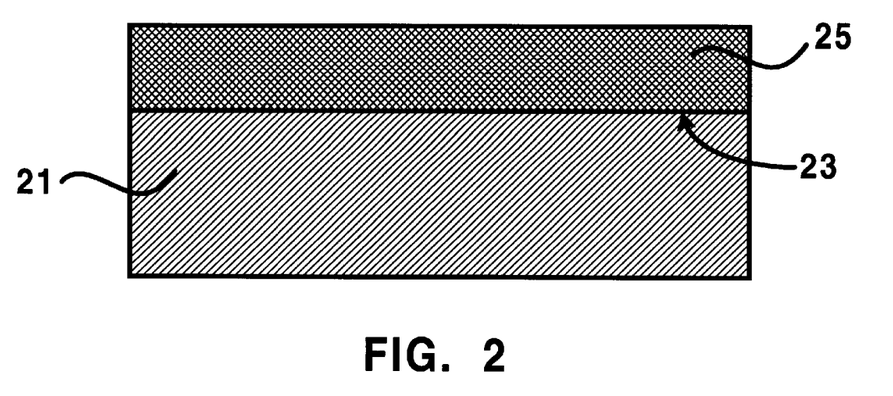
FIG. 2 is a cross-sectional view of a first unfavorable growth layer formed on a seeding surface of the favorable growth substrate according to the present invention.

In FIG. 2, the favorable growth substrate 21 is illustrated having a first unfavorable growth layer 25 formed on the seeding surface 23. The first unfavorable growth layer 25 can be a dielectric material including but not limited to silicon oxide ($SiO_2$), silicon nitride ($SiN_x$), gallium aluminum arsenide (GaAlAs), and aluminum oxide ($Al_2O_3$). The first unfavorable growth layer 25 can be formed using semiconductor fabrication techniques that are well understood in the art. For example, the first unfavorable growth layer 25 can be deposited using vapor deposition such as chemical vapor deposition (CVD), liquid phase chemical vapor deposition (LPCVD), and plasma enhanced chemical vapor deposition (PECVD). Alternatively, the first unfavorable growth layer 25 can be formed by oxidizing the favorable growth substrate 21. For instance, if Si is used for the favorable growth substrate 21, then the first unfavorable growth layer 25 can be formed by oxidizing the favorable growth substrate 21 in $O_2$ to form $SiO_2$. The first unfavorable growth layer 25 can also be formed by sputtering. For example, the first unfavorable growth layer 25 can be formed by sputtering a material such as $Al_2O_3$ or $SiN_3$. The thickness of the first unfavorable growth layer 25 will be application dependent. Typically, the thickness of the second unfavorable growth layer 41 will be about 1.0 $\mu$m or less.

Figure 3:
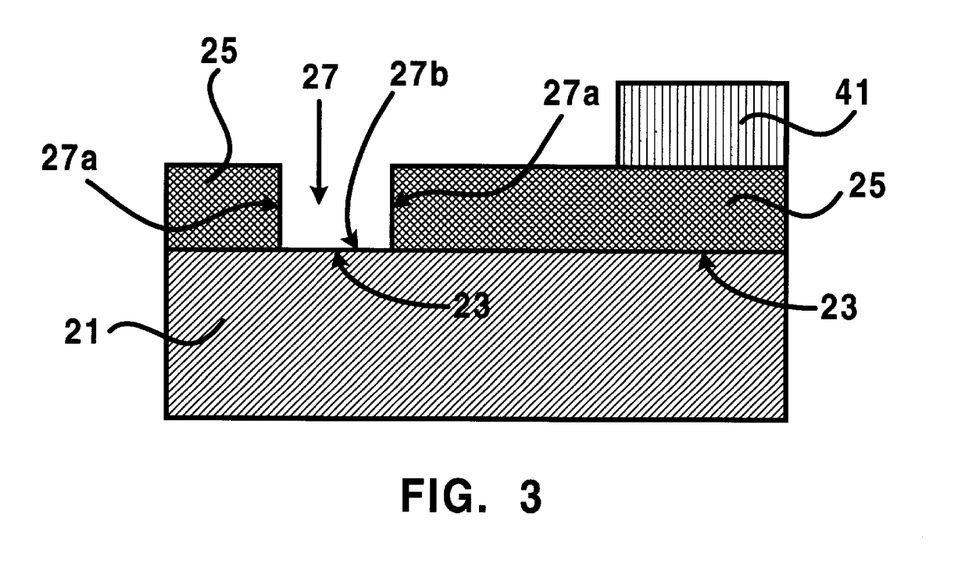
FIG. 3 is a cross-sectional view of a second unfavorable growth layer and an aperture formed in the first unfavorable growth layer according to the present invention.

In FIG. 3, an aperture 27 is formed in the first unfavorable growth layer 25. The aperture 27 extends through the first unfavorable growth layer 25 down to the seeding surface 23 of the favorable growth substrate 21 thereby exposing a portion of the seeding surface 23. The aperture 27 can be formed using photolithography to pattern a mask (not shown) on the first unfavorable growth layer 25 followed by etching through an opening in the mask. Wet or dry etching (i.e. plasma etching) can be used to form the aperture 27. For purposes of illustration, FIG. 3 shows the aperture 27 having substantially vertical sidewall surfaces 27a and a substantially horizontal bottom surface 27b; however, the sidewall surfaces 27a and the bottom surface 27b need not be vertical and horizontal respectively. For instance, the sidewall surfaces 27a can have sloped shape or an arcuate shape. The actual shape of the the sidewall surfaces 27a and the bottom surface 27b will depend on the etchant used and the etch selectivity of the first unfavorable growth layer 25. In any case, it is essential that the aperture 27 extend down to the seeding surface 23 of the favorable growth substrate 21 for reasons that will be set forth below in reference to FIGS. 4 and 5.

Figure 4:
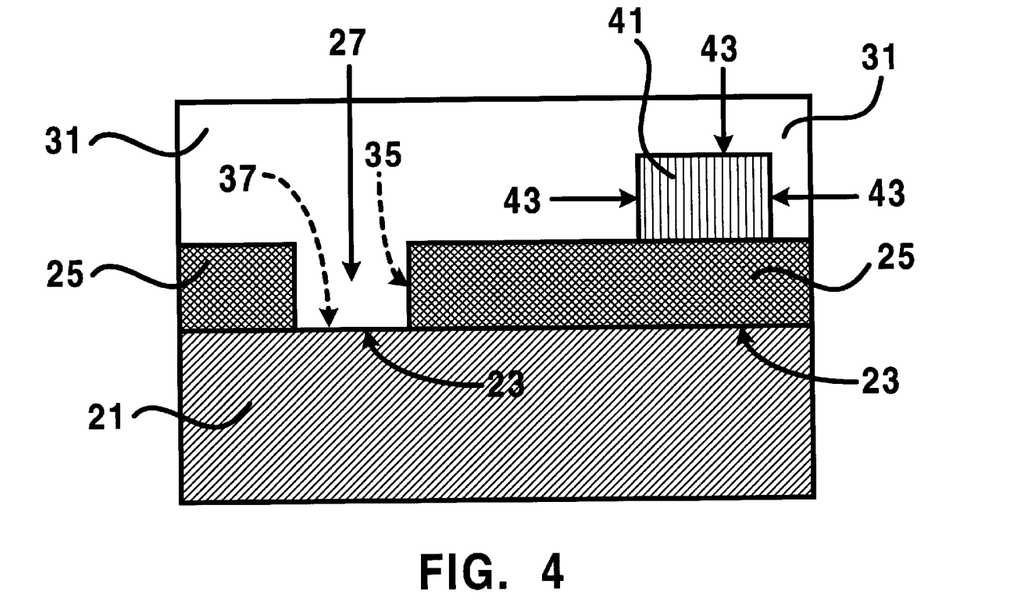
FIG. 4 is a cross-sectional view of an amorphous media layer deposited on the first unfavorable growth layer according to the present invention.

In FIG. 4, after the aperture 27 has been formed, an amorphous media layer 31 is formed on the first unfavorable growth layer 25. The amorphous media layer 31 covers at least a portion of the first unfavorable growth layer 25 and a portion of the amorphous media layer 31 fills the aperture 27 (as shown by dashed arrow 35) and is in contact with the seeding surface 23 (as shown by dashed arrow 37). Although the thickness of the amorphous media layer 31 will vary based on the application in which the amorphous media layer 31 is used, the thickness can be in a range from about 40 nm to about 600 nm. The amorphous media layer 31 on top of the first unfavorable growth layer 25 should be continuous with the first unfavorable growth layer 25 in the aperture 27 so that the thickness of the amorphous media layer $31 \geq$ a depth $D_A$ (see FIG. 11) of the aperture 27 (i.e. the thickness of the amorphous media layer 31 must be greater than or equal to the depth of the aperture 27).

Materials for the amorphous media layer 31 include indium selenide (InSe or $In_2Se_3$), indium telluride (InTe or $In_2Te_3$), and solid solutions and intermediate phases with a composition $InSe_{1-x}Te_x$. The materials for the amorphous media layer 31 can also include at least one dopant from groups II, IV, VI, or VII of the periodic table. Indium selenide, indium telluride, and solid solutions and intermediate phases of indium selenide and indium telluride offer superior electrical properties for a photoconductive or a photovoltaic storage medium.

For example, it is well known in the art to use GeSbTe and its compounds as an optical storage medium for CD-RW and DVD-RAM. GeSbTe and related phase change compounds have favorable properties for optical data storage in that they melt at low temperatures, recrystallize rapidly, and have a large reflectivity difference between the crystallized and the amorphous states. Additionally, GeSbTe has been demonstrated to have the chemical stability to support a large number of write-erase cycles, as is necessary for a rewritable data storage device. GeSbTe compounds were therefore the logical choice for the data storage medium in proposed photovoltaic or photoconductive detector storage schemes. These alternate schemes require the use of either a phase-sensitive, high-spatial resolution photoconductive or photovoltaic detector as a storage medium, where the detector can be used to sense electrons or photons. The efficient operation of a photoconductive detector requires a high-schubweg, high-resistivity medium material. The efficient operation of a photovoltaic detector requires a medium that will form a low-leakage diode with a good collection efficiency.

However, further investigation has shown that GeSbTe materials have a band gap of on 0.1 eV to 0.3 eV, depending on the composition. This small bandgap implied a high carrier density, causing high leakage currents in both photovoltaic and photoconductive detector storage schemes. In addition, the high conductivity of GeSbTe compounds prevented the formation of a depletion layer on the GeSbTe side of a heterojunction, limiting the collection efficiency and frustrating bit detection. The small bandgap of GeSbTe also cause poor thermal stability of the electrical properties and implied large band offsets for heterojunctions formed with technologically convenient semiconductors like Si (with an $E_g$=1.1 eV). The high defect density in GeSbTe also causes a low carrier lifetime and mobility, resulting in a poor schubweg, and in a high reverse-bias leakage in diode structures.

In contrast, indium selenide (InSe or $In_2Se_3$), indium telluride (InTe or $In_2Te_3$), and solid solutions and intermediate phases with a composition $InSe_{1-x}Te_x$ offer far superior electrical properties for the proposed electron and photon detection schemes. These materials combine the favorable phase-change properties of GeSbTe materials with good mobility and carrier lifetime, plus convenient and controllable resistivity and bandgap. Moreover, the density of defects is acceptably low and the chemical stability of the indium selenide (InSe or $In_2Se_3$), indium telluride (InTe or $In_2Te$), and the $InSe_{1-x}Te_x$ compounds is adequate. The amorphous media layer 31 of the present invention, depending on how it is specifically prepared, can have the high schubweg and high resistivity needed for operation in a photoconductive device, or the low carder-density, low defect density, and intermediate resistivity necessary for a photovoltaic device. Another advantage of the present invention is that polycrystalline indium based chaclogenides are easy to fabricate using a variety of standard semiconductor processing techniques.

The amorphous media layer 31 can be deposited using standard deposition techniques such as chemical vapor deposition (CVD), liquid phase chemical vapor deposition (LPCVD), plasma enhanced chemical vapor deposition (PECVD), thermal evaporation, sputtering, or liquid phase epitaxy.

Figure 5:
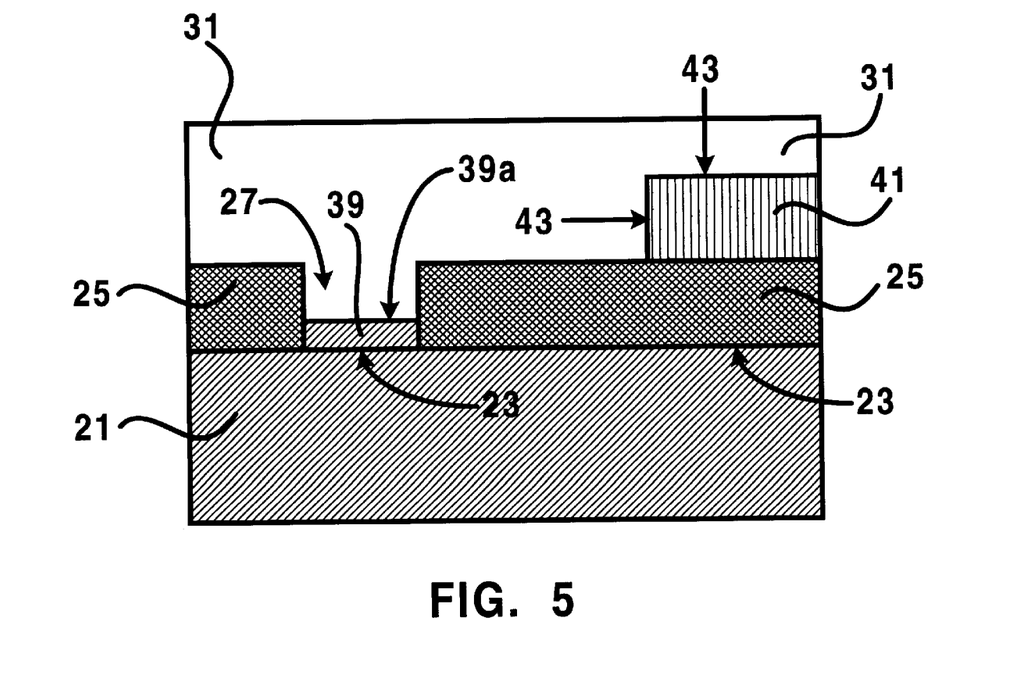
FIG. 5 is a cross-sectional view of nucleation of a crystalline phase of the amorphous media layer according to the present invention.
Figure 6:
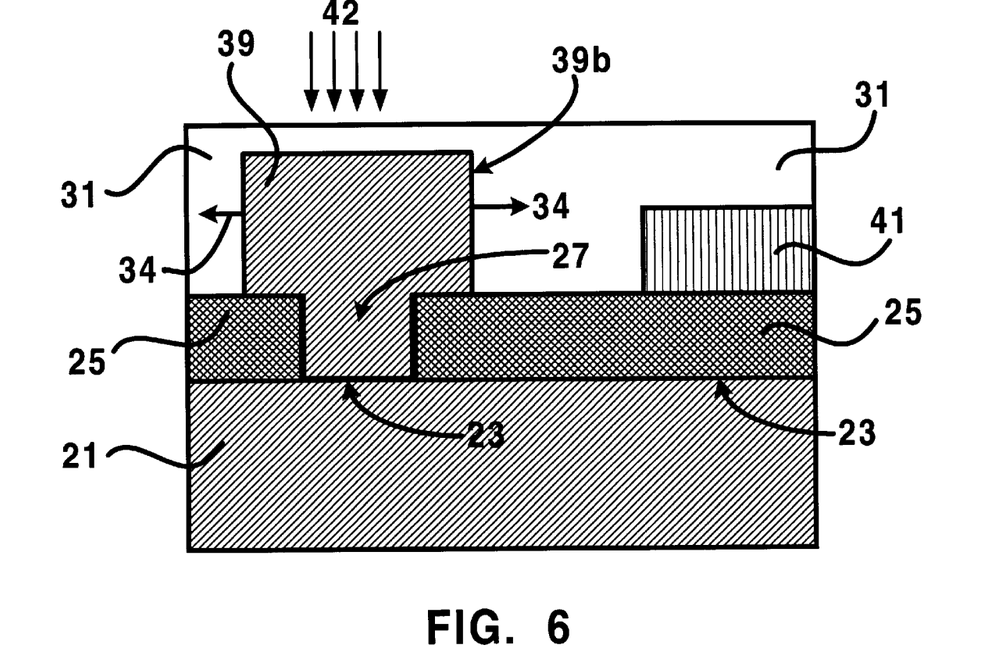
FIG. 6 is a cross-sectional view of propagation of the crystalline phase of the amorphous media layer according to the present invention.

In FIG. 5, a crystallized media layer 39 is formed by annealing the amorphous media layer 31 so that nucleation of a crystalline phase of the amorphous media layer 31 begins (see arrow 39a) at the seeding surface 23 and propagates throughout the entirety of a remainder of the amorphous media layer 31. In FIG. 6, nucleation of the crystalline phase has progressed (see arrow 39b) outward of the aperture 27 and into the remainder of the amorphous media layer 31. In one embodiment of the present invention, nucleation of the crystalline phase of the amorphous media layer 31 propagates in a substantially lateral direction as shown by arrows 34.

Figure 7:
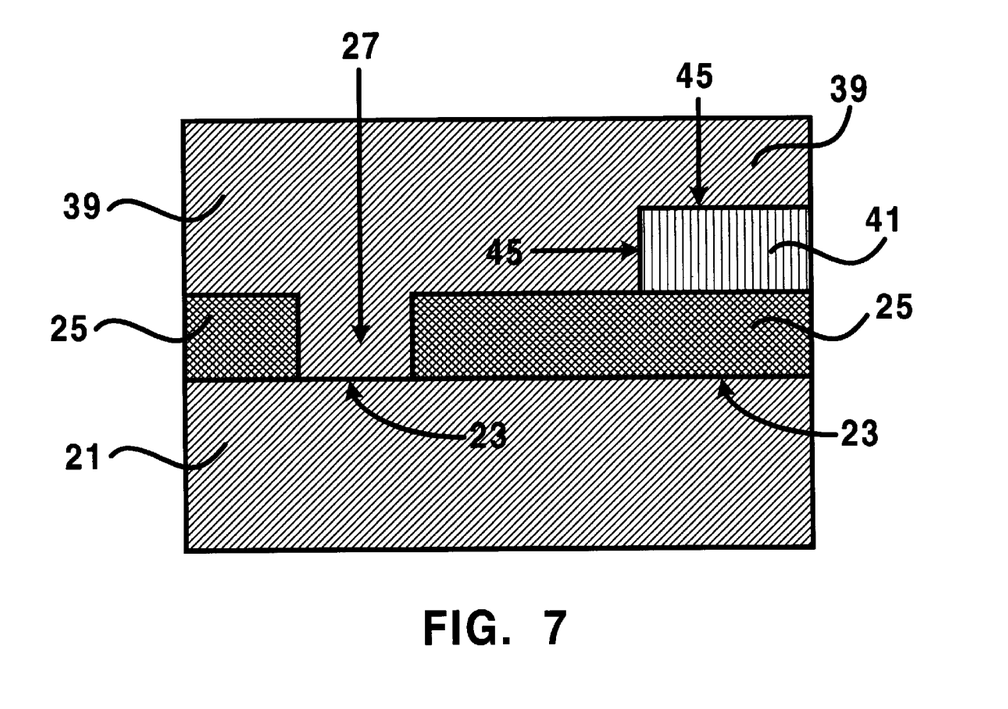
FIG. 7 is a cross-sectional view of a crystallized media layer according to the present invention.

In FIG. 7, nucleation of the crystalline phase has propagated throughout the entirety of the amorphous media layer 31 and formation of the crystallized media layer 39 is complete.

The amorphous media layer 31 can be annealed by applying heat to the amorphous media layer 31 in a furnace. For instance, the furnace can be a vacuum furnace. Alternatively, a reactive gas or an inert gas can be introduced to the furnace during the annealing process. The temperature of the furnace should be slowly ramped up over a period of time during the annealing process to ensure that nucleation of the crystalline phase (39a) begins at the seeding surface 23 of the favorable growth substrate 21. Furnace temperatures in a range from about 150° C. to about 300° C. can be used to anneal the amorphous media layer 31. An upper limit for the temperature of the furnace is the crystallization temperature of the amorphous media layer 31.

Alternatively, the amorphous media layer 31 can be annealed by irradiating the amorphous media layer 31 with a laser beam to heat the amorphous media layer 31. The laser beam can be generated by a gas laser, such as an argon laser, for example. Or the laser bean can be generated by an excimer laser, such as a XeCl excimer laser, for example. Preferably, irradiation of the amorphous media layer 31 should begin with the laser beam incident on a portion of the amorphous media layer 31 that is centered over the aperture 27 as shown by arrows 42 in FIG. 6. Moreover, it is desirable to prevent the laser beam from dwelling on any given portion of the amorphous media layer 31 for too long a period of time to prevent overheating of the amorphous media layer 31. To that end, the laser beam should be moved across the amorphous media layer 31 by imparting relative motion between the amorphous media layer 31 and the laser beam or by scanning the laser beam across the amorphous media layer 31. For instance, the laser beam can be raster scanned across the amorphous media layer 31.

Figure 8:
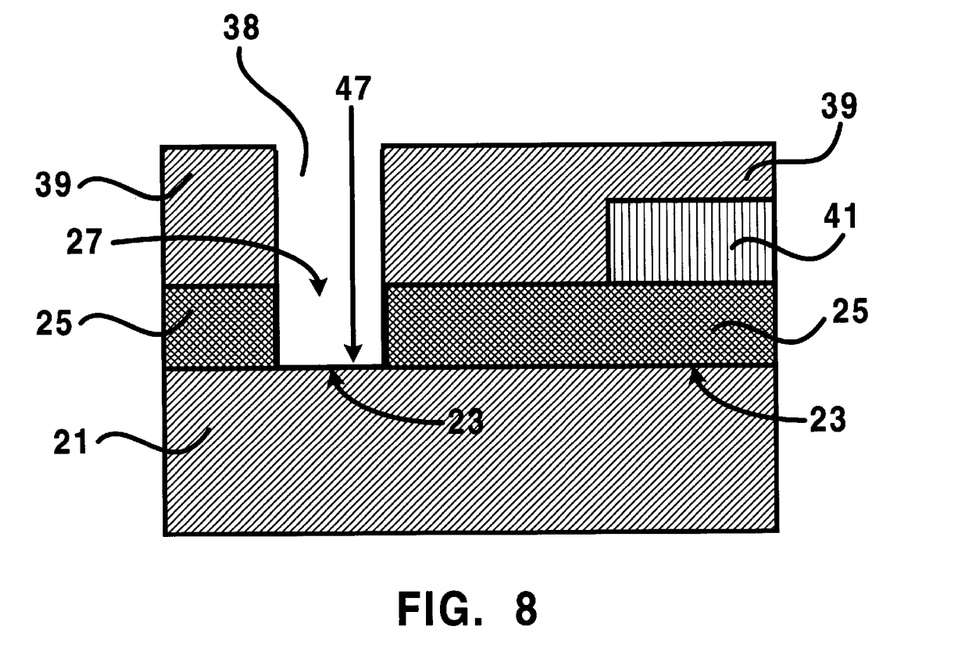
FIG. 8 is a cross-sectional view illustrating etching of the crystallized media layer to electrically insulate the crystallized media layer from the favorable growth substrate according to the present invention.
Figure 9:
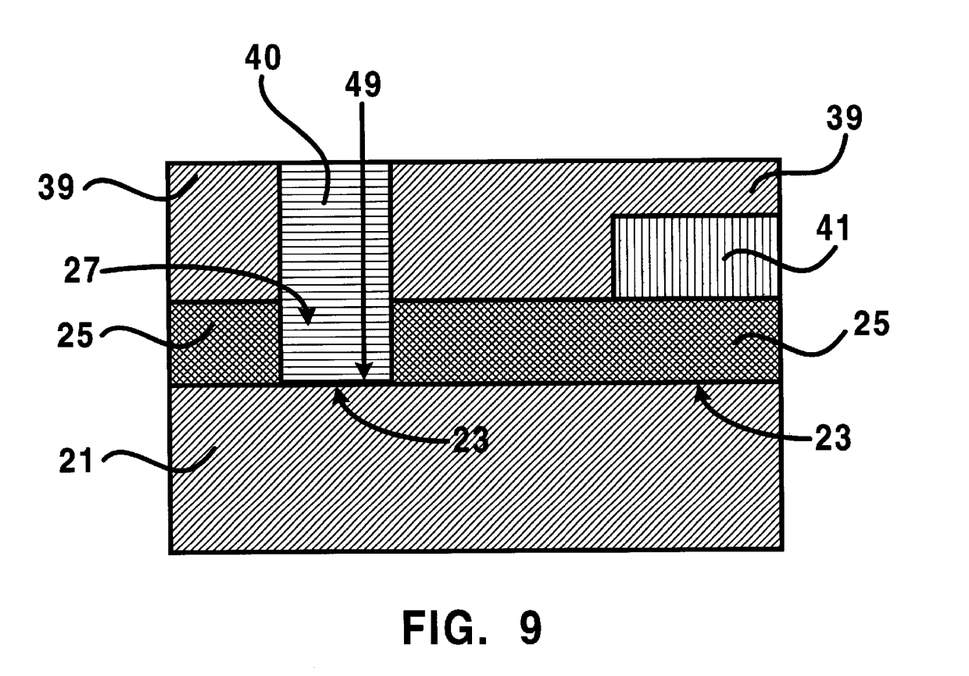
FIG. 9 is a cross-sectional view illustrating treating the crystallized media layer to electrically insulate the crystallized media layer from the favorable growth substrate according to the present invention.

In FIGS. 8 and 9, the crystallized media layer 39 is treated to electrically insulate the crystallized media layer 39 from the favorable growth substrate 21. In FIG. 8, the treating step includes patterning a mask (not shown) and then etching the crystallized media layer 39 through the mask to remove (by etching) a portion 38 of the crystallized media layer 39 that is in contact with the favorable growth layer 21. The portion 38 extends down to the seeding surface 23 as shown by arrow 47. As a result, the crystallized media layer 39 and the favorable growth substrate 21 are electrically insulated from each other. Photolithography and etching processes that are well know in the art may be used treat the crystallized media layer 39. For instance, reactive ion etching (RIE) can be used to etch the crystallized media layer 39.

In FIG. 9, the treating step includes patterning a mask (not shown) on the crystallized media layer 39. Next, an electrical property (i.e. electrical conductivity) of a portion 40 of the crystallized media layer 39 is altered by ion implantation through the mask so that the altered electrical property results in the crystallized media layer 39 being electrically insulated from the favorable growth substrate 21. Because the portion 40 has electrical properties that render it electrically insulated from the favorable growth substrate 21, at a point of contact 49 between the portion 40 and the seeding surface 23, there is no electrical communication between the favorable growth substrate 21 and the crystallized media layer 39.

Alternatively, instead of ion implantation through the mask, the portion 40 can be rendered electrically insulating by oxidizing the crystallized media layer 39 through the mask so that the portion 40 that is in contact with the favorable growth substrate 21 (see arrow 49) is oxidized so that the favorable growth substrate 21 is electrically insulated from the crystallized media layer 39.

On the other hand, the portion 40 can be rendered electrically insulating by reactively annealing the crystallized media layer 39 through the mask so that the portion 40 that is in contact with the favorable growth substrate 21 (see arrow 49) is annealed so that the favorable growth substrate 21 is electrically insulated from the crystallized media layer 39.

In one embodiment of the present invention, as illustrated in FIG. 3, a second unfavorable growth layer 41 can be formed on the first unfavorable growth substrate 25. The second unfavorable growth layer 41 can be formed on the first unfavorable growth substrate 25 prior to the step of patterning the aperture 27, or the second unfavorable growth layer 41 can be formed on the first unfavorable growth substrate 25 after the patterning and etching step. After forming the amorphous media layer 31, at least a portion of the amorphous media layer 31 is in contact with the second unfavorable growth layer 41 as shown by arrows 43 in FIGS. 4 and 5. The thickness of the second unfavorable growth layer 41 will be application dependent.

In another embodiment of the present invention, the second unfavorable growth layer 41 can be made of an electrically conductive material that includes but is not limited to refractory metals such as molybdenum (Mo), titanium (Ti), titanium nitride (TiN), tungsten (W), chromium (Cr), niobium (Nb), and tantalum (Ta). For instance, for electron-addressed storage devices, the second unfavorable growth layer 41 can be used as an electrode (see U.S.

Pat. No. 5,557,596 to Gibson et al.). In contrast, for optically addressed storage devices, the second unfavorable growth layer 41 can be made of the above metals or from a transparent conduct such as indium tin oxide (InSnO also referred to as ITO) (see U.S. Pat. No. 5,625,617 to Hopkins et al.).

In one embodiment of the present invention, the second unfavorable growth layer 41 can be made of a dielectric material that includes but is not limited to silicon oxide ($SiO_2$), silicon nitride ($SiN_x$), gallium aluminum arsenide (GaAlAs), and aluminum oxide ($Al_2O_3$).

Figure 10:
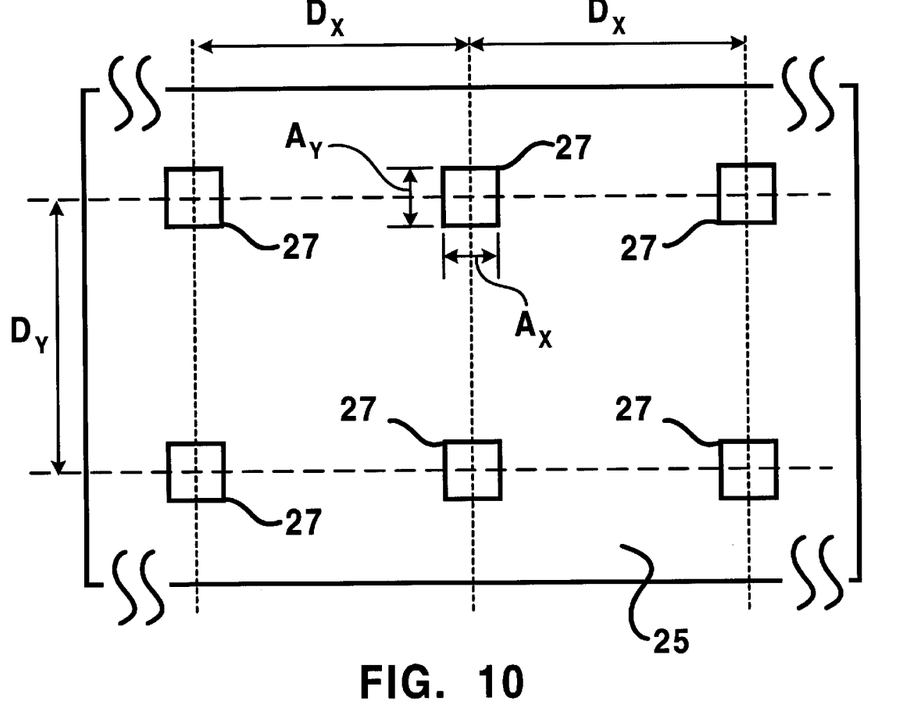
FIG. 10 is a top plan view illustrating a horizontal and vertical pitch between adjacent apertures and dimensions of the apertures according to the present invention.
Figure 11:
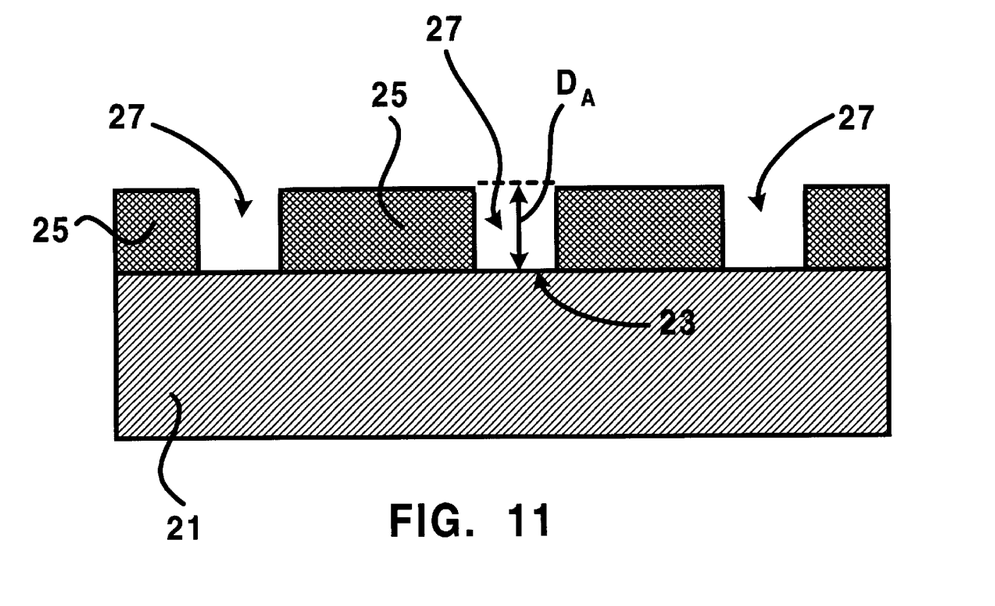
FIG. 11 is a cross-sectional view of the apertures of FIG. 10 formed in the first unfavorable growth layer according to the present invention.

In FIGS. 10 and 11, the first unfavorable growth layer 25 is shown having a plurality of apertures 27 formed therein. The apertures 27 are spaced apart in a grid by a vertical pitch $D_y$ and a horizontal pitch $D_x$. Moreover, the apertures 27 have dimensions of $A_y$ and $A_x$. Although for purposes of illustration, the apertures are shown having a rectangular shape, the actual shape of the apertures will be application dependent and other shapes such as a polygon shape, a circular shape, or an arcuate shape are possible. The dimensions $A_y$ and $A_x$ will vary based on the application; however, the dimensions $A_y$ and $A_x$ can be from about 0.5 $\mu$m to about 2.0 $\mu$m. The vertical pitch $D_y$ and the horizontal pitch $D_x$ can be from about 5 times to about 10 times the dimensions of $A_y$ and $A_x$. For instance, if $A_y=A_x=0.5$ $\mu$m, then using a factor of 10 (i.e. 10x), the spacings for the vertical and horizontal pitches are $D_y=D_x=5.0$ $\mu$m. Typically, the aperture 27 will have a depth $D_A$ that is substantially equal to the thickness of the first unfavorable growth layer 25, as illustrated in FIG. 11. Moreover, the thickness of the amorphous media layer 31 should be $\geq D_A$.

Although several embodiments of the present invention have been disclosed and illustrated, the invention is not limited to the specific forms or arrangements of parts so described and illustrated. The invention is only limited by the claims.

What is claimed is:

1. A method for crystallizing an amorphous film formed on an underlaying layer having an unfavorable crystalline growth morphology, comprising:
   providing a favorable growth substrate having a seeding surface thereon;
   forming a first unfavorable growth layer on the seeding surface;
   patterning and then etching an aperture extending through the first unfavorable growth layer down to the seeding surface;
   forming an amorphous media layer on the first unfavorable growth layer so that a portion of the amorphous media layer fills the aperture and is in contact with the seeding surface;
   forming a crystallized media layer by annealing the amorphous media layer so that nucleation of a crystalline phase of the amorphous media layer begins at the seeding surface and propagates throughout the entirety of a remainder of the amorphous media layer; and
   treating the crystallized media layer to electrically insulate the crystallized media layer from the favorable growth substrate.

2. The method of claim 1 and further comprising the step of forming a second unfavorable growth layer on the first unfavorable growth layer.

3. The method of claim 2, wherein the second unfavorable growth layer is formed on the first unfavorable growth layer prior to patterning the aperture.

4. The method of claim 2, wherein after depositing the amorphous media layer, at least a portion of the amorphous media layer is in contact with the second unfavorable growth layer.

5. The method of claim 2, wherein the first unfavorable growth layer is a dielectric material selected from the group consisting of silicon oxide, silicon nitride, gallium aluminum arsenide, and aluminum oxide.

6. The method of claim 2, wherein the second unfavorable growth layer is an electrically conductive material selected from the group consisting of molybdenum, titanium, titanium nitride, tungsten, chromium, niobium, indium tin oxide, and tantalum.

7. The method of claim 2, wherein the second unfavorable growth layer is a dielectric material selected from the group consisting of silicon oxide, silicon nitride, gallium aluminum arsenide, and aluminum oxide.

8. The method of claim 1, wherein the favorable growth substrate has a thickness of about 100 micrometers or less.

9. The method of claim 1, wherein the amorphous media layer is a material selected from the group consisting of indium selenide, indium telluride, and solid solutions and intermediate phases with a composition $InSe_{1-x}Te_x$.

10. The method of claim 9, wherein the amorphous media layer includes at least one dopant selected from the group consisting of group 11, group IV, group VI, and group VII of the periodic table.

11. The method of claim 1, wherein the favorable growth substrate is a semiconductor material selected from the group consisting of silicon, silicon germanium, and gallium arsenide.

12. The method of claim 11, wherein the seeding surface is oriented along a predetermined crystalline plane of the favorable growth substrate.

13. The method of claim 12, wherein the predetermined crystalline plane is selected from the group consisting of a 111 crystalline plane and a 100 crystalline plane.

14. The method of claim 1, wherein the first unfavorable growth layer is a dielectric material selected from the group consisting of silicon oxide, silicon nitride, gallium aluminum arsenide, and aluminum oxide.

15. The method of claim 1, wherein nucleation of the crystalline phase of the amorphous media layer propagates in a substantially lateral direction.

16. The method of claim 1, wherein the annealing step includes heating the amorphous media layer by irradiating the amorphous media layer with a laser beam to crystallize the amorphous media layer.

17. The method of claim 16, wherein the laser beam is generated by a laser selected from the group consisting of a gas laser, and an excimer laser.

18. The method of claim 16, wherein the annealing step further includes scanning the laser beam across the amorphous media layer by imparting relative motion between the laser beam and the amorphous media layer.

19. The method of claim 1, wherein the annealing step includes applying heat to the amorphous media layer in an atmosphere selected from the group consisting of a vacuum, a reactive gas, and an inert gas.

20. The method of claim 1, wherein the treating step includes patterning the crystallized media layer and then etching the crystallized media layer to remove a portion of the crystallized media layer that is in contact with the favorable growth substrate so that the crystallized media layer is electrically insulated from the favorable growth substrate.

21. The method of claim 1, wherein the treating step includes patterning a mask on the crystallized media layer followed by altering an electrical property of a portion of the crystallized media layer by ion implantation through the mask so that the altered electrical property results in the crystallized media layer being electrically insulated from the favorable growth substrate.

22. The method of claim 1, wherein the treating step includes patterning a mask on the crystallized media layer followed by oxidizing the crystallized media layer through the mask so that a portion of the crystallized media layer that is in contact with the favorable growth substrate is oxidized such that the crystallized media layer is electrically insulated from the favorable growth substrate.

23. The method of claim 1, wherein the treating step includes patterning a mask on the crystallized media layer followed by reactively annealing the crystallized media layer through the mask so that a portion of the crystallized media layer that is in contact with the favorable growth substrate is annealed such that the crystallized media layer is electrically insulated from the favorable growth substrate.

24. The method of claim 1, wherein the amorphous media layer comprises a material selected from the group consisting of a III–VI material, a I–III–VI material, and a IV–V–VI material.

* * * * *